US006952376B2

(12) United States Patent
Somasekhar et al.

(10) Patent No.: US 6,952,376 B2
(45) Date of Patent: Oct. 4, 2005

(54) METHOD AND APPARATUS TO GENERATE A REFERENCE VALUE IN A MEMORY ARRAY

(75) Inventors: Dinesh Somasekhar, Portland, OR (US); Yibin Ye, Portland, OR (US); Muhammad M. Khellah, Tigard, OR (US); Fabrice Paillet, Hillsboro, OR (US); Stephen H. Tang, Pleasanton, CA (US); Ali Keshavarzi, Portland, OR (US); Shih-Lien Lu, Portland, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/740,551

(22) Filed: Dec. 22, 2003

(65) Prior Publication Data

US 2005/0135169 A1 Jun. 23, 2005

(51) Int. Cl.[7] .................................................. G11C 7/02

(52) U.S. Cl. ...................... 365/210; 365/203; 365/207; 365/196

(58) Field of Search ................................ 365/210, 203, 365/200, 207, 196

(56) References Cited

U.S. PATENT DOCUMENTS

| | | | | |
|---|---|---|---|---|
| 5,881,008 A * | 3/1999 | Becker | ....................... | 365/210 |
| 6,501,695 B1 * | 12/2002 | Brown | ....................... | 365/203 |
| 6,717,877 B2 * | 4/2004 | Suzuki et al. | ............... | 365/210 |
| 6,781,863 B2 * | 8/2004 | Kang | ......................... | 365/145 |

* cited by examiner

*Primary Examiner*—Anh Phung
*Assistant Examiner*—N Nguyen
(74) *Attorney, Agent, or Firm*—Fleshner & Kim, LLP

(57) ABSTRACT

An apparatus and method for generating a reference in a memory circuit are disclosed. At least two dummy bit-cells are used to generate a reference voltage. One cell has high value stored and the other has a low value stored. The cells are activated and discharged into respective bit-lines. The bit-lines are equalized during the discharge process to generate a reference that is approximately a mid point between a high value cell and a low value cell.

30 Claims, 5 Drawing Sheets

METHOD AND APPARATUS TO GENERATE A REFERENCE VALUE IN A MEMORY ARRAY

FIELD

The present invention relates to semiconductor memories. In particular, the present invention relates to high-density memory arrays.

BACKGROUND

Memory arrays can perform the read-out of cells by utilizing an amplifier (e.g., a sense amplifier) to detect the state of the cells. This can be accomplished by enabling a row of memory cells by activating a word-line, which places the state of the cells on bit-lines. The amplifier distinguishes the state of the cell by comparing it to a reference. A high output is flagged if the state of memory cell is higher than the reference and a low output is flagged otherwise.

However, generating a reference to compare against the amplifier output is not a trivial problem. Often, the optimal reference is centered symmetrically between the low and high values placed by the memory cell on the bit-lines. Various techniques can be used to generate this reference. For example, differential memory cells implicitly generate the reference. For instance, SRAM cells typically use a differential bit-line pair. One of the bit-lines is discharged for a cell storing a high while the other is discharged when the cell stores a low. The sense-amplifier makes its decision by comparing the pair of bit-lines.

However, the use of differential bit-lines may not be available as an option for high-density memory arrays. This is because the cell may not have the space to accommodate a pair of bit-lines. For such cells the reference generation has to be carried out explicitly.

Explicit generation of the reference is commonly carried out in DRAM cells that typically employ a dummy cell. The dummy cell is discharged on an unselected bit-line (e.g., a bit-line not connected to an active memory cell). Since DRAMs are typically implemented by discharging the charge in the memory cell on the bit-line, a mid-level reference is generated by making a dummy cell with half the capacitance of the actual memory cell and charging it to the voltage corresponding to the logic high of the cell. This technique works under the assumption that the stored voltage in the cell for logic state of zero is close to zero. Alternatively a full sized memory cell charged to the mid-level voltage can be used.

A mid-level reference can be generated when the memory cell generates a current output as a signature of the state of the cell. This current discharges the selected bit-line with the rate of discharge being different for a high "1" or low "0" voltage being stored in the cell (see, e.g., FIGS. 1A and 1B). Assume for purposes of illustration that a cell storing a logical high discharges bit-line 112 at a higher rate than the cell storing a logic low discharges bit-line 102 (see, e.g., FIG. 1B). Also assume that Ihigh and Ilow are the current generated from the cell for a high value and low value respectively. With the capacitance of each bit-line being Cbl, the voltage for the high and low states after time t is given by Vhigh and Vlow.

$$Vhigh = \frac{Ihigh}{Cbl}t \qquad \text{(Equation 1)}$$

$$Vlow = \frac{Ilow}{Cbl}t \qquad \text{(Equation 2)}$$

A mid-level reference corresponds to a voltage of (Vhigh+Vlow)/2 at time t. The generation of the mid-level reference can be accomplished by discharging a bit-line with a current corresponding to the average of the high and low state discharge current (i.e., (Ihigh+Ilow)/2). One method may accomplish this by monitoring the discharge currents of two dummy cells, one holding a zero and the other a one and averaging them using an analog current mirror based implementation.

BRIEF DESCRIPTION OF THE DRAWINGS

The following represents brief descriptions of the drawings in which like reference numerals refer to like elements wherein.

DETAILED DESCRIPTION

Figure 1A:
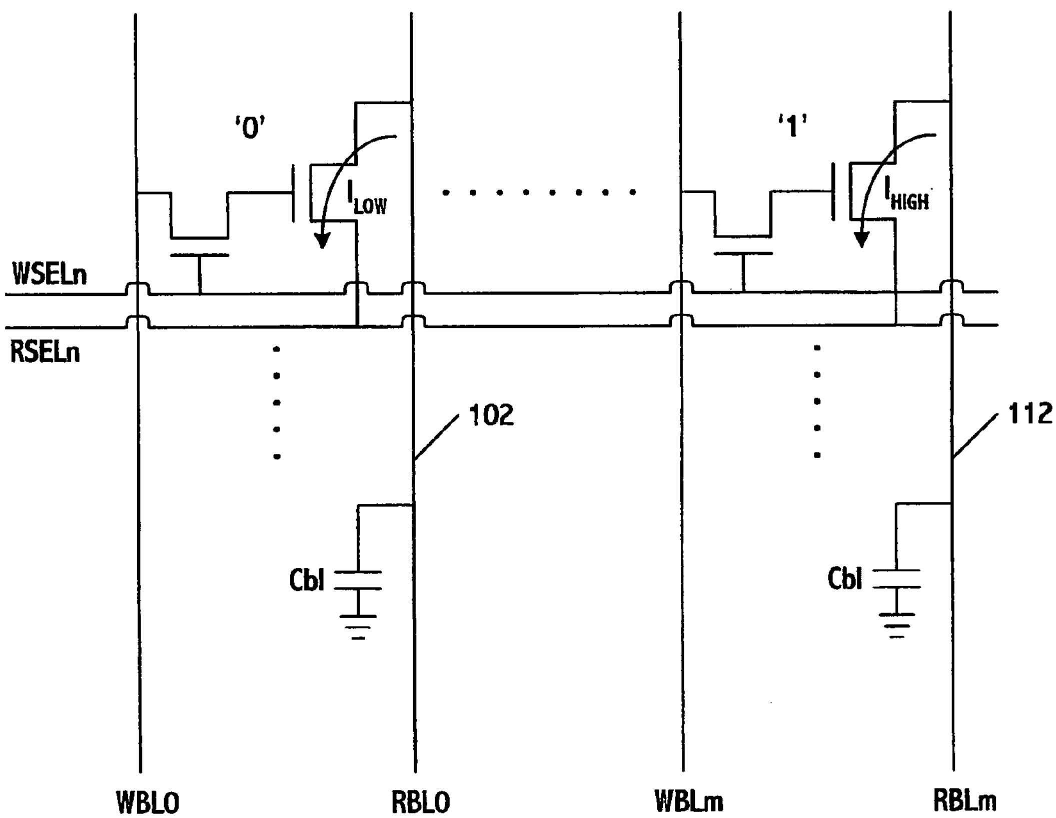
FIG. 1A illustrates a memory array according to one arrangement.
Figure 1B:
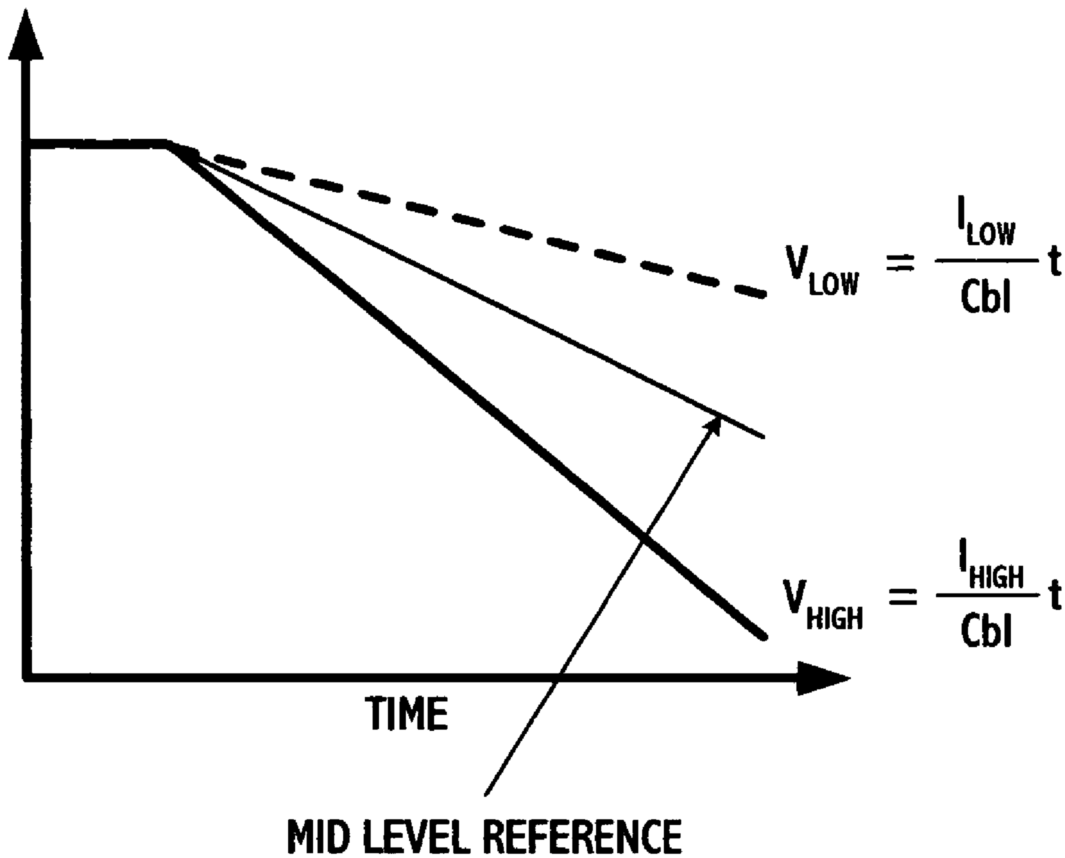
FIG. 1B illustrates a mid-level reference as a function of Ihigh and Ilow.

In the following detailed description, reference is made to the accompanying drawings that show, by way of illustration, specific embodiments in which the invention may be practiced. In the drawings, like numerals describe substantially similar components throughout the several views. While logic values are described as HIGH/ON or LOW/OFF these descriptions of HIGH/ON and LOW/OFF are intended to be relative to the discussed arrangement and/or embodiments. That is, a value may be described as HIGH/ON in one arrangement, although it may be LOW/OFF in another (e.g., complementary) arrangement as will be appreciated by those skilled in the art.

The following embodiments are described in sufficient detail to enable those skilled in the art to practice the invention. Other embodiments may be utilized, and structural, logical, and intellectual changes may be made without departing from the scope of the present invention. Moreover, it is to be understood that various embodiments of the invention, although different, are not necessarily mutually exclusive. For example, a particular feature, structure, or characteristic described in one embodiment may be included within other embodiments. The following detailed description is not to be taken in a limiting sense, and the scope of the present invention is defined only by appended claims, along with the full scope of equivalence to which such claims are entitled.

Figure 2A:
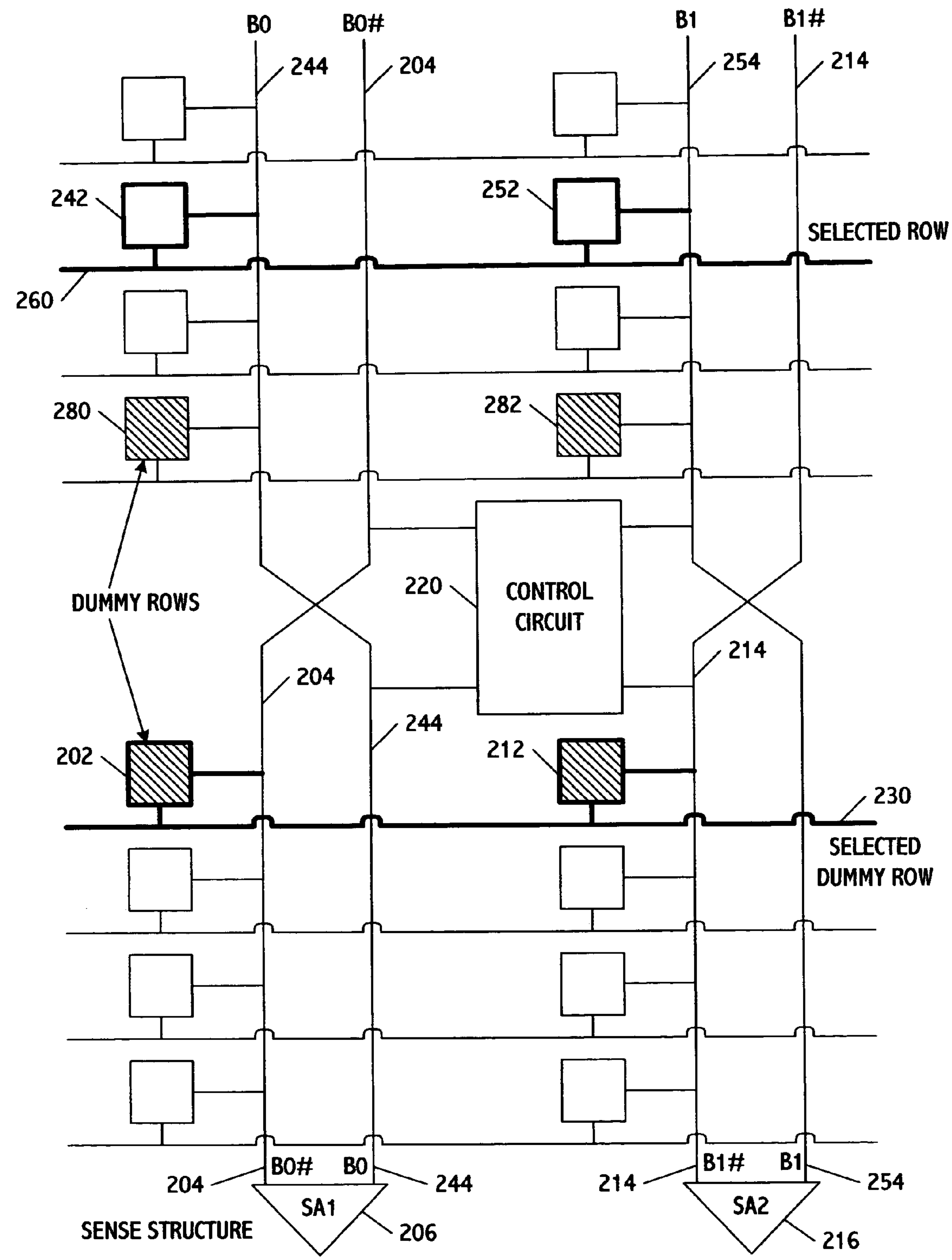
FIG. 2A illustrates a cell memory array according to an example embodiment of the present invention.

As illustrated in FIG. 2A, an embodiment of the present invention accomplishes the generation of the mid-level voltage by discharging two dummy cells (e.g., 202 and 212). As shown there in FIG. 2A, there are four dummy cells and two dummy rows. In the following description of the operation, only two dummy cells, 202 and 212, are discussed which are activated by row select line 230. The other pair of dummy cells (280, 282) is not discussed. However, those skilled in the art will appreciate that the operation of the other dummy cells is similar.

For example, dummy cells 280, 282 are activated when a memory row in the bottom half of the array in FIG. 2A is selected (then 202 and 212 will not be activated and T4 in circuit 20 is not turned on. Instead, T3 will be turned on). Further, those skilled in the art will appreciate that a series of memory cells (i.e., a column in the top or bottom half of the array) are coupled to the same bit-lines as the dummy cell and that the dummy cells in the opposite portion of the memory array will be activated. For example, dummy cell 202 coupled to bit-line 204 will be activated when the series of memory cells in the top half of the array coupled to bit-line 244 is read. Likewise, dummy cell 280 coupled to bit-line 244 will be activated when the series of memory cells in the bottom half of the array coupled to bit-line 204 is read.

Referring to the operation of dummy cells 202 and 212, dummy cell 202 can hold a logic zero (e.g. LOW) and dummy cell 212 can hold a logic one (e.g. HIGH) on two separate unselected bit-lines 204 and 214, respectively. Methods for storing values into memory cells are well known in the art and accordingly will not be described further herein. However, it should be noted that the refresh/writing of values in the dummy cells can be performed with the other memory cells or at other rates/cycles.

To generate an average of the voltage these two unselected bit-lines 204 and 214 are connected by enabling a control circuit 220. This causes the reference voltage (Vref) developed to be governed by the following relation:

$$Vref = \frac{Ihigh + Ilow}{2 \cdot Cbl} t \quad \text{(Equation 3)}$$

This reference voltage corresponds to the mid-level voltage. This technique can be implemented using standard memory components. Additionally, the dummy cells 202, 212 can operate under the same voltage conditions as actual cells. Those skilled in the art will appreciate that operation of the dummy cells at a different voltage condition causes the generated currents that differ from actual cell Ihigh and Ilow values.

Figure 2B:
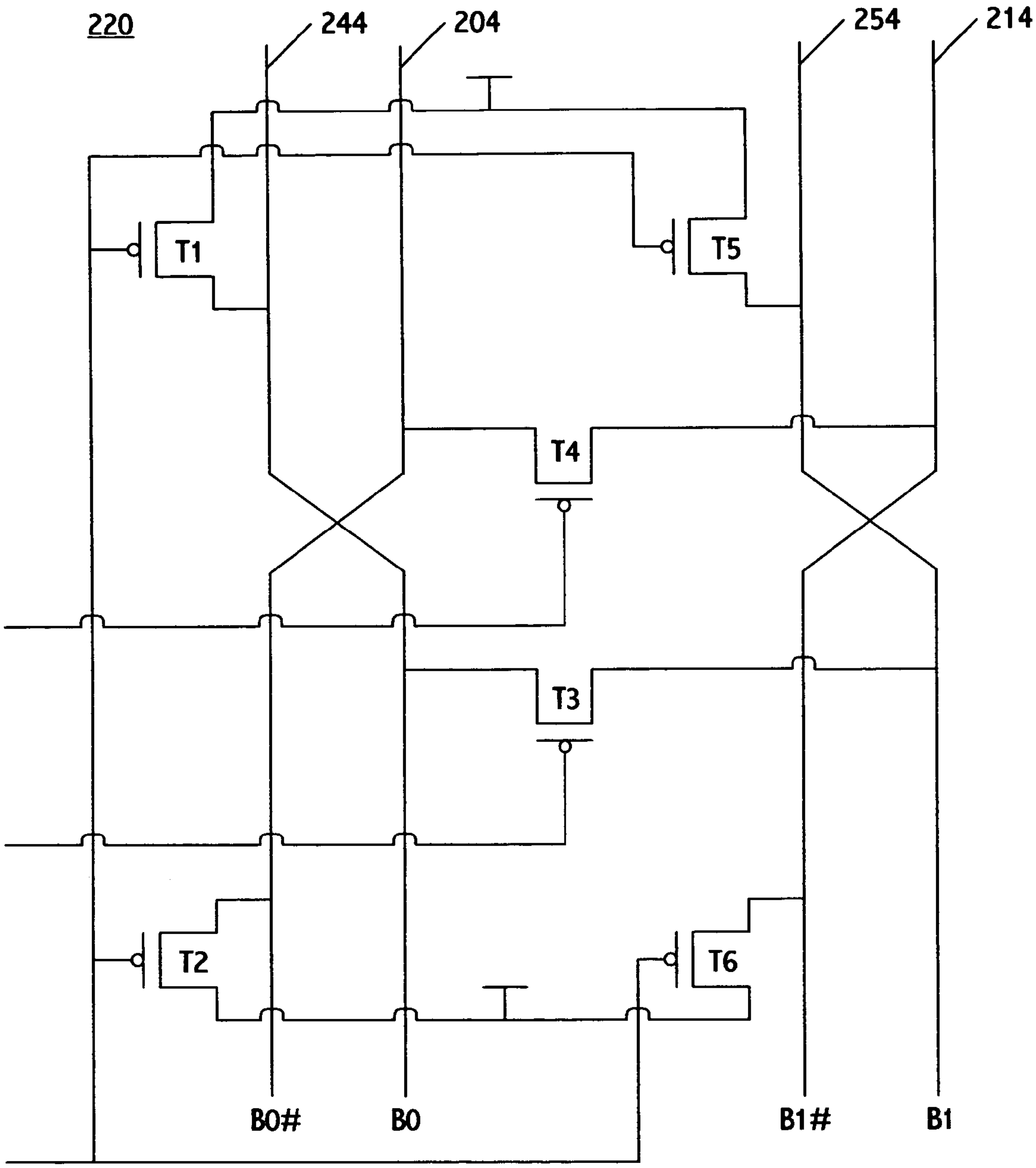
FIG. 2B illustrates a control circuit of a memory array according to an example embodiment of the present invention.

FIGS. 2A and 2B illustrate a memory array that includes two transistor gain cells, according to an example embodiment of the present invention. Those skilled in the art will appreciate that 2T cells such as illustrated in FIG. 1A can be used in the memory array of FIG. 2A. Further, the embodiments of the invention are not limited to the 2T configuration. Other memory cell configurations (e.g., 3T gain cells) can be used.

Memory cells 242 and 252 generate currents on bit-lines 244 and 254 when read word-line (RWL) 260 is activated. Bit-lines (e.g., 204, 214, 244, 254) in the memory array are precharged to supply voltage using control circuit 220. For example, transistors T1, T2, T5, and T6 are used to precharge the bit-lines, as illustrated in FIG. 2B.

A vertically twisted bit-line enables the generation of a selected and unselected bit-line in the pitch of the bit-cell. For example, the cell can accommodate two bit-lines inspite of having just one routing track by placing the bit-lines vertically on layers Metal 2 (M2) and Metal 4 (M4), for example, in a semiconductor device. Those skilled in the art will appreciate that the twisted bit-line structure is widely used in memory (e.g., DRAM) designs. M4 is level 4 metal, which typically runs at a vertically higher level than M2 in the semiconductor. For example, in FIG. 2A, the upper half of bit-line 204 can run on M4, and the lower half can run on M2. Bit-line 244 runs in an opposite way. For example, a vertical twist can mean 204 on M4 goes down and continues on M2 while 244 on M2 goes up and continues on M4.

A cell is read out by the following sequence of operations. Bit-lines are precharged and equalized by turning on transistors T1, T2, T3, T4, T5 and T6 (e.g., as illustrated in FIG. 2B). RWL 260 is activated and the cells (e.g., 242, 252) on the selected row are enabled on the bit-lines (e.g., 244, 254). Bit-line differential voltage develops on bit-lines 244 and 254. Simultaneous to activating RWL 260, dummy cells (e.g., 202 and 212) corresponding to zero and one state cells are enabled on unselected bit-lines (e.g., 204 and 214). Additionally, transistor T4 is left enabled to act as an equalizing device of the unselected bit-lines. Leaving transistor T4 enabled accomplishes the averaging of voltages on bit-lines 204 and 212. Sense-amplifiers 206 and 216 can be fired and isolated from the bit-lines 204, 244, and 214, 254, respectively. Transistor T4 can be disabled at this point.

Sense-amplifier 206 compares bit-lines 204 and 244 (e.g., B0 and B0#), while sense-amplifier 216 compares bit-lines 214 and 254 (e.g., B1 and B1#). This comparison allows for the discrimination of the cell state (i.e., whether the cell is a "1" or "0") of cell 242 and 254, respectively. Upon completion of the read operation, the foregoing process can be repeated for the next read cycle.

As can be appreciated from the foregoing description, embodiments of the present invention may include first and second dummy bit-cells and a control circuit. A first dummy bit-cell can be configured to store a low value and is coupled to a first bit-line. A second dummy bit-cell can be configured to store a high value and is coupled to a second bit-line. A control circuit is configured to equalize the first and second bit-lines when an associated word-line is enabled.

As illustrated in FIG. 2B, the control circuit may include a transistor T4 coupled between the first and the second bit-lines. The transistor can be a PMOS transistor, for example, P-type because bit-lines are pre-charged to HIGH. However, those skilled in the art will appreciate that other transistor types can be used. A second transistor T2 is coupled to the first bit-line 204 and a third transistor T6 is coupled to the second bit-line 214. The second T2 and third T6 transistors are configured to precharge the first 204 and second 214 bit-lines, respectively. A fourth transistor T3 is coupled between a third bit-line 244 and a fourth bit-line 254 is configured to equalize the third 244 and fourth 254 bit-lines. A fifth transistor T1 is coupled to the third bit-line 244 and a sixth transistor T5 is coupled to the fourth bit-line 254. The fifth T1 and sixth T5 transistors are configured to precharge the third 244 and fourth 254 bit-lines, respectively.

As illustrated in FIG. 2B, the third bit-line 244 is coupled to at least one bit-cell 242 and a first sense amplifier 206. The first bit-line 204 and the third bit-line 244 are inputs to the first sense amplifier 206. Additionally, a fourth bit-line 254 is coupled to at least one bit-cell 252 and a second sense amplifier 216. The second bit-line 214 and the fourth bit-line 254 are inputs to the second sense amplifier 216.

The first sense amplifier 206 is configured to generate a high output if a voltage on the first bit-line 204 is less than a voltage on the third bit-line 244, and a low output if the voltage on the first bit-line 204 is greater than or equal to the voltage on the third bit-line 244. The second sense amplifier 216 is configured to generate a high output if a voltage on the second bit-line 214 is less than a voltage on the fourth bit-line 254, and a low output if the voltage on the second bit-line 214 is greater than or equal to the voltage on the fourth bit-line 254. Thus, the first bit line 204 serves as a reference for the third bit-line 244 and allows a positive determination of the state of the selected bit-cell 242. Likewise, the second bit line 214 serves as a reference for the fourth bit-line 254 and allows a positive determination of the state of the selected bit-cell 252.

Those skilled in the art will also appreciate methods according to embodiments of the present invention from the foregoing description. For example, embodiments of the present invention may generate a reference in a memory device. This may include precharging and equalizing a first bit-line 204 and a second bit-line 214. A high value is discharged from a first dummy bit cell 202 coupled to the first bit-line 204 and a low value is discharged from a second dummy bit cell 212 coupled to the second bit line 214. The equalization of the first 204 and second bit-lines 214 may be maintained during the discharging process. This may generate a reference voltage on the first 204 and second 214 bit line that is approximately a mid-level voltage between a high level voltage generated by discharging a high value bit cell and a low level voltage generated by discharging a low value. For example, the reference voltage (Vref) can be determined from Equation (3) above.

Additionally, embodiments of the present invention may include selecting a third bit-cell 242 coupled to a third bit-line 244 and a fourth bit-cell 252 coupled to a fourth bit-line 254. The equalization on the first 204 and second 214 bit-lines may be maintained while selecting the third 242 and fourth 252 bit-cells.

A voltage (Vref) on the first bit-line 204 is compared with a voltage on the third bit-line 244 and a voltage (Vref) on the second bit-line 214 is compared with a voltage on the fourth bit-line 254. Then, a first output (e.g., from sense amplifier 206) is generated based on the comparison of the first bit-line 204 and the third bit-line 244 and a second output (e.g., from sense amplifier 206) based on the comparison of the second bit-line 214 and the fourth bit-line 254.

The first output is a high output if a voltage on the first bit-line 204 is less than a voltage on the third bit-line 244, and a low output if the voltage on the first bit-line 204 is greater than or equal to the voltage on the third bit-line 244. Likewise, the second output is a high output if a voltage on the second bit-line 214 is less than a voltage on the fourth bit-line 254, and a low output if the voltage on the second bit-line 214 is greater than or equal to the voltage on the fourth bit-line 254.

Figure 3:
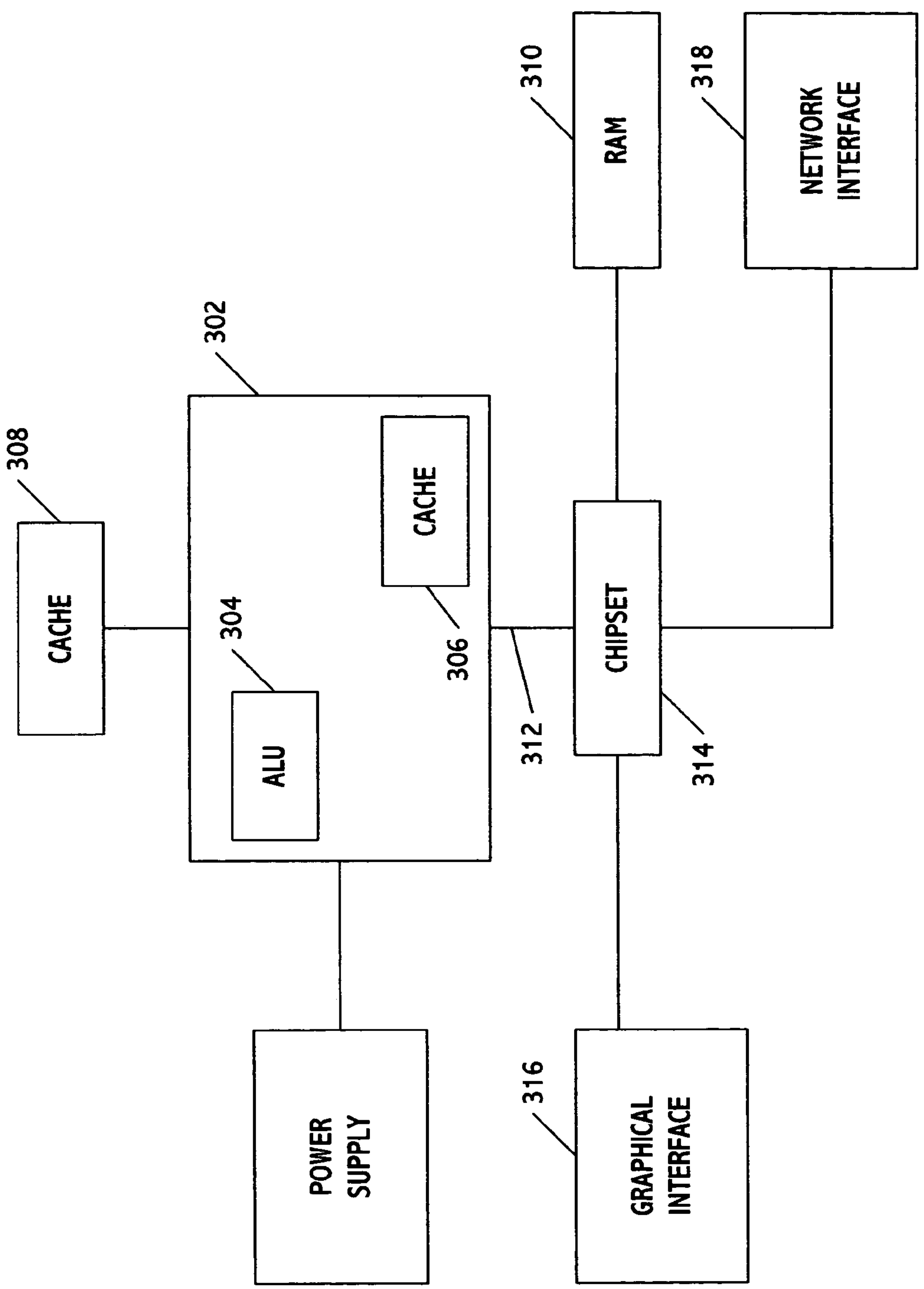
FIG. 3 illustrates a computer system according to an example embodiment of the present invention.

Embodiments of the present invention can be used in a wide variety of applications including computer systems. FIG. 3 shows an exemplary illustration of a computer system. The computer system can include a microprocessor 302, which can include memory arrays as detailed in the foregoing description. Microprocessor 302 can include many sub-blocks such as an arithmetic logic unit (ALU) 304 and an on-die cache 306. The microprocessor 302 may also communicate to other levels of cache, such as off-die cache 308. Higher memory hierarchy levels such as system memory 310 are accessed via host bus 312 and a chip set 314. In addition, other off-die functional units such as a graphics accelerator 316 and a network interface controller 318, to name just a few, may communicate with the microprocessor 302 via appropriate busses or ports. For example, system memory 310, off-die cache memory 308, and/or on-die cache memory 306 can comprise memory arrays according to embodiments of the present invention detailed in the foregoing description.

The foregoing embodiments and advantages are merely exemplary and are not to be construed as limiting the present invention. The present teaching can be readily applied to other types of apparatuses. The description of the present invention is intended to be illustrative, and not to limit the scope of the claims.

Many alternatives, modifications, and variations will be apparent to those skilled in the art. For example, the foregoing description has been illustrated using N-type and/or P-type MOSFETs. However, those skilled in the art will appreciate that a complementary form can be realized by utilizing the complementary transistor type either to the entire arrangement or portions thereof and constitutes additional embodiments of the present invention. Further, although embodiments of the invention have been illustrated and described in the foregoing description as individual circuits and/or arrangements elements, the individual circuits and arrangements elements can be integrated into larger scale devices (e.g., microprocessors) or can be separated into smaller arrangements/circuits without departing from the scope of embodiments of the present invention.

What is claimed is:

1. An apparatus comprising:

a first dummy bit-cell configured to store a first value coupled to a first bit-line;

a second dummy bit-cell configured to store a second value coupled to a second bit-line; and a control circuit configured to equalize the first and second bit-lines to a mid-level voltage when an associated word-line is enabled, the mid-level voltage being approximately based on an average of the first value stored in the first dummy bit-cell and the second value stored in the second dummy bit-cell.

2. The apparatus of claim 1, wherein the first value is a LOW voltage value and the second value is a HIGH voltage value, and wherein the control circuit is configured to establish the mid-level voltage on both the first and second bit-lines that is approximately the average of the HIGH and LOW voltage values.

3. The apparatus of claim 1, wherein the control circuit comprises a transistor coupled between the first bit-line and the second bit-line.

4. The apparatus of claim 3, wherein the transistor comprises a PMOS transistor or a NMOS transistor.

5. The apparatus of claim 1, wherein the first and second bit-lines are vertically twisted bit-lines.

6. The apparatus of claim 1, further comprising:

a third bit-line coupled to at least one bit-cell; and a first sense amplifier coupled to the first bit-line and the third bit-line.

7. The apparatus of claim 6, further comprising:

a fourth bit-line coupled to at least one bit-cell; and a second sense amplifier coupled to the second bit-line and the fourth bit-line.

8. The apparatus of claim 7, wherein the first sense amplifier is configured to generate a HIGH output if a voltage on the first bit-line is less than a voltage on the third bit-line, and a LOW output if the voltage on the first bit-line is greater than or equal to the voltage on the third bit-line.

9. The apparatus of claim 8, wherein the second sense amplifier is configured to generate a HIGH output if a voltage on the second bit-line is less than a voltage on the fourth bit-line, and a LOW output if the voltage on the second bit-line is greater than or equal to the voltage on the fourth bit-line.

10. The apparatus of claim 1, wherein the control circuit comprises:

a first transistor coupled between the first bit-line and the second bit-line;

a second transistor coupled to the first bit-line; and a third transistor coupled to the second bit-line, wherein the second and third transistors are configured to precharge the first and second bit-lines, respectively.

11. The apparatus of claim 10, wherein the control circuit further comprises:

a fourth transistor coupled between a third bit-line and a fourth bit-line configured to equalize the third and fourth bit-lines;

a fifth transistor coupled to the third bit-line; and a sixth transistor coupled to the fourth bit-line, wherein the fifth and sixth transistors are configured to precharge the third and fourth bit-lines, respectively.

12. The apparatus of claim 1, wherein the apparatus comprises at least one of a computer system, a microprocessor, on-die cache memory, off-die cache memory, random access memory, and a memory array.

13. A method for generating a reference in a memory device, the method comprising:

precharging and equalizing a first bit-line and a second bit-line;

discharging a first voltage from a first dummy bit cell coupled to the first bit-line and a second voltage from a second dummy bit cell coupled to the second bit-line; and generating a reference voltage by maintaining the equalization of the first and second bit-lines during the discharging process.

14. The method of claim 13, wherein maintaining the equalization generates a reference voltage on the first and second bit-line that is approximately a mid-level voltage between the first voltage generated by discharging a HIGH value bit-cell and the second voltage generated by discharging a LOW value bit-cell.

15. The method of claim 14, wherein the reference voltage (Vref) corresponds to the following equation:

$$Vref = \frac{Ihigh + Ilow}{2 \cdot Cbl} t$$

wherein Ihigh is a HIGH value discharge current generated by discharging the HIGH value bit-cell, Ilow is a LOW value discharge current generated by discharging the LOW value bit-cell, Cbl is a bit-line capacitance and t is time.

16. The method of claim 13, further comprising:

selecting a third bit-cell coupled to a third bit-line and a fourth bit-cell coupled to a fourth bit-line, wherein the equalization on the first and second bit-lines is maintained while selecting the third and fourth bit-cells;

comparing a voltage on the first bit-line with a voltage on the third bit-line and a voltage on the second bit-line with a voltage on the fourth bit-line; and generating a first output based on the comparison of the first bit-line and the third bit-line and a second output based on the comparison of the second bit-line and the fourth bit-line.

17. The method of claim 16, further comprising:

determining the first output is a HIGH output if the voltage on the first bit-line is less than the voltage on the third bit-line or a LOW output if the voltage on the first bit-line is greater than or equal to the voltage on the third bit-line; and determining the second output is a HIGH output if a voltage on the second bit-line is less than a voltage on the fourth bit-line, or a LOW output if the voltage on the second bit-line is greater than or equal to the voltage on the fourth bit-line.

18. A memory array comprising:

a plurality of word lines;

a plurality of cells, each coupled to one of the word lines, wherein the plurality of cells includes a first dummy cell and a second dummy cell and a plurality of memory cells;

a first bit-line and a second bit-line coupled to a first sense amplifier configured to output a signal based on a voltage comparison between the first bit-line and the second bit-line, wherein the first bit-line is coupled to the first dummy cell and the second bit-line is coupled to least one memory cell;

a third bit-line coupled to the second dummy cell; and a control circuit configured to equalize the bit-lines coupled to the first and second dummy cells when an associated word-line is enabled.

19. The memory array of claim 18, further comprising:

a second sense amplifier coupled to the third bit-line and a fourth bit-line, and configured to output a signal based on a voltage comparison between the third bit-line and the fourth bit-line, wherein the fourth bit-line is coupled to at least one memory cell.

20. The memory array of claim 19, further comprising:

a first series of memory cells coupled to the first bit-line;

a third dummy cell coupled to the second bit-line; and a second series of memory cells coupled to the second bit-line, wherein the first dummy cell is configured to be activated when the second series of memory cells is accessed and wherein the third dummy cell is configured to be activated when the first series of memory cells is accessed.

21. The memory array of claim 20, wherein the first and second bit-lines form a first pair of bit-lines that are vertically twisted and wherein the third and fourth bit-lines form a second pair of bit-lines that are vertically twisted.

22. The memory array of claim 20, further comprising:

a third series of memory cells coupled to the third bit-line;

a fourth dummy cell coupled to the fourth bit-line; and a fourth series of memory cells coupled to the fourth bit-line, wherein the second dummy cell is configured to be activated when the fourth series of memory cells is accessed and wherein the fourth dummy cell is configured to be activated when the third series of memory cells is accessed.

23. The memory array of claim 22, wherein the control circuit is configured to equalize the bit-lines coupled to the first and second dummy cells when memory cells of the second and fourth series are read and to equalize the bit-lines coupled to the third and fourth dummy cells when memory cells of the first and third series are read.

24. The memory array of claim 19, wherein the control circuit comprises:

a first transistor coupled between the first bit-line and the third bit-line;

a second transistor coupled to the first bit-line; and a third transistor coupled to the third bit-line, wherein the second and third transistors are configured to precharge the first and third bit-lines, respectively.

25. The memory array of claim 24, wherein the control circuit further comprises:

a fourth transistor coupled between a second bit-line and a fourth bit-line configured to equalize the second and fourth bit-lines;

a fifth transistor coupled to the second bit-line; and a sixth transistor coupled to the fourth bit-line, wherein the fifth and sixth transistors are configured to pre-charge the second and fourth bit-lines, respectively.

26. The memory array of claim 18, wherein the first sense amplifier is configured to generate a HIGH output if a voltage on the first bit-line is less than a voltage on the second bit-line, and a LOW output if the voltage on the first bit-line is greater than or equal to the voltage on the second bit-line.

27. The memory array of claim 19, wherein the second sense amplifier is configured to generate a HIGH output if a voltage on the third bit-line is less than a voltage on the fourth bit-line, and a LOW output if the voltage on the third bit-line is greater than or equal to the voltage on the fourth bit-line.

28. An electronic system comprising:

a network interface to network with other systems;

a memory device to store data; and a processor to process the data stored in the memory device, wherein the system includes a memory array comprising:

a plurality of word lines;

a plurality of cells including a first dummy cell, a second dummy cell and a plurality of memory cells each coupled to one of the word lines;

a first bit-line and a second bit-line coupled to a first sense amplifier to output a signal based on voltages on the first bit-line and the second bit-line, the first bit-line being coupled to the first dummy cell and the second bit-line being coupled to least one memory cell;

a third bit-line coupled to the second dummy cell; and a control circuit to equalize the bit-lines coupled to the first and second dummy cells when an associated word-line is enabled.

29. The electronic system of claim 28, further comprising:

a second sense amplifier coupled to the third bit-line and a fourth bit-line, the second sense amplifier to output a signal based on voltages between the third bit-line and the fourth bit-line, the fourth bit-line being coupled to at least one memory cell.

30. The electronic system of claim 28, further comprising:

a first series of memory cells coupled to the first bit-line;

a third dummy cell coupled to the second bit-line; and a second series of memory cells coupled to the second bit-line, the first dummy cell to be activated when the second series of memory cells is accessed and the third dummy cell to be activated when the first series of memory cells is accessed.

* * * * *